United States Patent
Tsai

(12) 
(10) Patent No.: US 6,410,353 B1
(45) Date of Patent: Jun. 25, 2002

(54) CONTACT CHAIN FOR TESTING AND ITS RELEVANTLY DEBUGGING METHOD

(75) Inventor: Tsung-Liang Tsai, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 09/862,485

(22) Filed: May 23, 2001

(51) Int. Cl.[7] .......................... G01R 31/26; H01L 21/66
(52) U.S. Cl. .............................. 438/14; 438/11; 438/15; 438/18; 257/48; 257/107; 257/288
(58) Field of Search ................ 438/11, 14, 15, 438/18, 128, 279, 294; 357/17, 19; 257/48, 107, 119, 124, 173

(56) References Cited

U.S. PATENT DOCUMENTS

| 5,105,235 A | * | 4/1992 | Tomita | 257/288 |
| 5,270,655 A | * | 12/1993 | Tomita | 324/501 |
| 5,502,317 A | * | 3/1996 | Duvvury | 257/107 |
| 5,872,018 A | * | 2/1999 | Lee | 438/18 |
| 6,107,108 A | * | 8/2000 | Chen et al. | 438/128 |

* cited by examiner

Primary Examiner—David Nelms
Assistant Examiner—Dao Nguyen
(74) Attorney, Agent, or Firm—Birch, Stewart, Kolasch & Birch, LLP

(57) ABSTRACT

The present invention provides a structure of a contact chain comprising a substrate of a first conductive type, a dielectric layer on the substrate, a plurality of contact structures and two probe pads. The contact structures are connected in series and have two ends. Each contact structure comprises a contact hole in the dielectric layer and conductive material in the contact hole, for electrically contacting with a first doped layer of a second conductive type. The first doped region is formed on the substrate. Two probe pads are coupled to the two ends, respectively. The contact chain further comprises a means for selectively coupling the first doped layer to the substrate. When the first doped layer is not coupled to the substrate, the total resistance of the contact chain can be measured through the two probe pads. During FIB failure analysis, the first doped layer can be forced to couple to the substrate, such that the PN junction between the first doped layer and the substrate will not interfere with the analytic process.

12 Claims, 7 Drawing Sheets

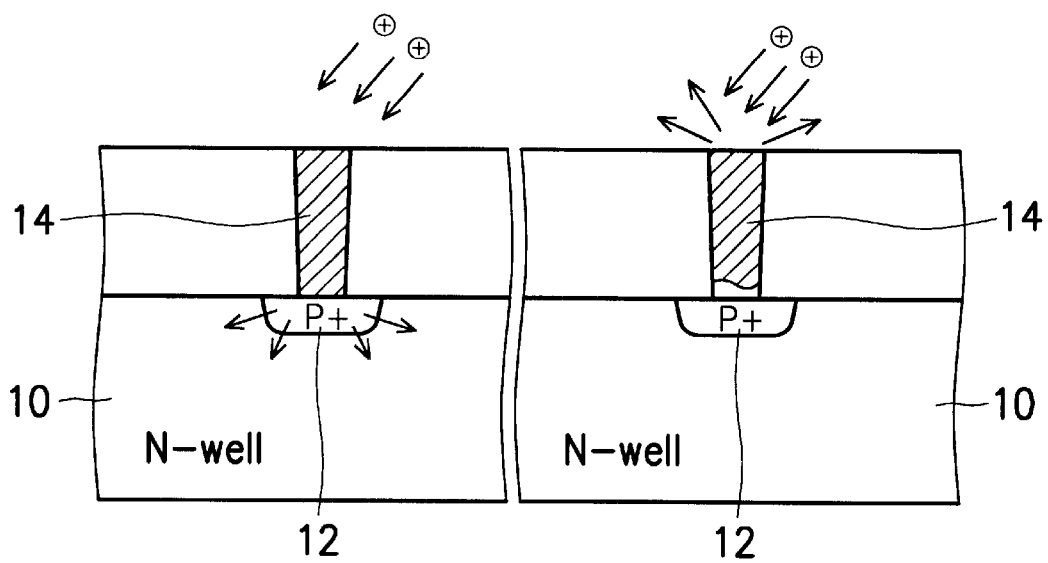
FIG. 2A (PRIOR ART)
FIG. 2B (PRIOR ART)
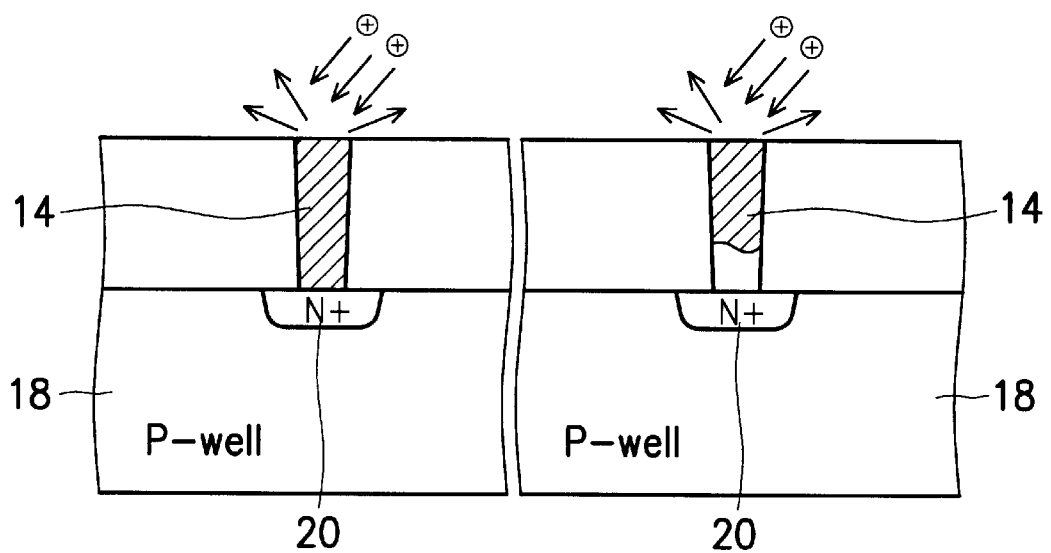
FIG. 2C (PRIOR ART)
FIG. 2D (PRIOR ART)

CONTACT CHAIN FOR TESTING AND ITS RELEVANTLY DEBUGGING METHOD

BACKGROUND OF THE INVENTION

1. Field of the Invention

The present invention relates to a structure of a contact chain for semiconductor product testing. In particular, the present invention relates to a contact chain that is capable of testing and failure analysis.

2. Description of the Related Art

In order to monitor the quality of semiconductor chips, several testing devices are fabricated on scribe lines between the semiconductor chips. For example, a PMOS or a NMOS on a scribe line should have similar electrical attributes with the PMOS or the NMOS in the semiconductor chips nearby. Thus, by testing or measuring the electrical attributes of the testing devices, one can obtain the device performance in the semiconductor chips. Among these testing devices, there is a specific test device referred to as a contact chain, serving to obtain an average resistance of the contacts in the semiconductor chips.

Contacts can be classified into at least 3 categories, CG, CS-P and CS-N. CG denotes the contact from the first metal layer to a gate layer or electrode; CS-P denotes the contact from the first metal layer to a P-type substrate; and CS-N denotes the contact from the first metal layer to an N-type substrate. Please refer to FIGS. 1A and 1B. FIG. 1A illustrates the layout of a conventional contact chain. FIG. 1B illustrates a cross-section of the contact chain in FIG. 1A, when it is implemented by contacts of CS-P. By examining the patterns of the P+ doped layers 12, contact holes 14 and the first metal strips 16, a plurality of contacts connected in series are easily observed. An average contact resistance of one contact of CS-P can be obtained by dividing the total resistance measured between Pad1 and Pad2 by the total number of the contacts in series. In other words, the average contact resistance of one contact of CS-P, CS-N or CG can be obtained from a contact chain of a respective kind of contact.

When the average contact resistance obtained by probing and measuring doesn't fall into the allowable range, one or more contacts in the contact chain have problems. This induces an action called failure analysis to find out the root causes, so problems in the manufacturing process may be found and rectified.

One of the conventional tools for failure analysis is a focused ion beam (FIB), which functions like the well-known scanning electric microscope (SEM). By scanning an object with a positive-charged ion beam, the microscopic structure of the object can be observed. Two more functions of FIB are well known cutting an observed object by ion bombardment to achieve a cross-section view, and forming a connection route on its surface by depositing metal ions for circuit repairing.

Before analyzing the root cause of a failure contact chain by FIB, it must be polished to remove the metal strips, exposing the underlying dielectric layer.

FIGS. 2A and 2B show how the ion beam interacts with a normal, well-formed contact of CS-P and an abnormal, unfilled contact of CS-P, respectively. A contact chain always consists of hundreds of contacts. Therefore, without the exact location of an abnormal contact, failure analysis will be almost impossible. As shown in FIG. 2A, when the ion beam is scanning a normal contact of CS-P, positive charges can flow, through the conductive material inside the contact hole 14 and the forward-biased PN junction between the P+ doped layer and the N-type well 10, to the grounded N-type well 10. In other words, a normal contact of CS-P can discharge the charges carried by the impacted ions. When the ion beam scans an abnormal, unfilled contact of CS-P, as shown in FIG. 2B, positive charges are accumulated since the conduct material doesn't fill the contact hole 14 enough to provide a conductive path, thus the positive charges arriving early repel the positive charges arriving late. The image formation theory of FIB is based upon the amount of secondary electrons induced by positive ions bombarding on the observed point of the object. In other words, the different interactions on surfaces cause the different gray levels on the monitor. If positive charges are accumulated, which occurs in FIG. 2B, the positive charges arriving late are repelled by the positive charges arriving early, such that secondary electron can't be further generated. What occurs in the abnormal contact in FIG. 2B comes out of a gray level darker than that in the normal contact in FIG. 2A. Therefore, the normal and the abnormal contacts of CS-P are easily recognized by checking the gray levels shown on the monitor of an FIB tool.

However, FIB can't be used to recognize normal contacts of CS-N and abnormal contacts of CS-N. FIGS. 2C and 2D show how the ion beam interacts with a normal, well-formed contact of CS-N and an abnormal, unfilled contact of CS-N, respectively. In FIG. 2C, the PN junction formed between N+ doped layer 20 and P-type well 18 is reverse-biased when the positive ion beam is scanning the contact when the P-type well 18 is grounded, thereby blocking the positive charges from discharging. Nor are the positive charges in FIG. 2D discharged since the conductive material in contact hole doesn't occupy the contact hole sufficiently to form a conductive path. Therefore, all the contacts of CS-N, either normal or abnormal, accumulate positive charges in their contact hole and have similar gray levels displayed on the monitor of a FIB tool, so that they are difficult to differentiate from each other.

SUMMARY OF THE INVENTION

The main object of this invention is to provide a novel structure for a contact chain capable of recognizing the normal contacts of CS-N and the abnormal contacts of CS-N during FIB failure analysis.

Another object of this invention is to provide an analyzing method for recognizing the root cause of the failure contact chain of the present invention.

To achieve the mentioned objects, the present invention provides a structure of a contact chain comprising a substrate of a first conductive type, a dielectric layer on the substrate, a plurality of contact structures and two probe pads. The contact structures are connected in series and have two ends. Each contact structure comprises a contact hole in the dielectric layer and conductive material in the contact hole, for serving to electrically contact with a first doped layer of a second conductive type. The first doped region is formed on the substrate. Two probe pads are coupled to the two ends, respectively. The contact chain further comprises a means for selectively coupling the first doped layer to the substrate. When the substrate is not coupled to the first doped layer, the total contact resistance can be measured by probing the probe pads.

The present invention further provides a method for measuring the total resistance of a contact chain. The contact chain has a plurality of contact structures connected in series and two ends. Each contact structure comprises a contact hole in a dielectric layer and conductive material in the contact hole and serves to electrically contact with a first doped layer of a second conductive type. The first doped region is formed on a substrate of a first conductive type. Two probe pads are coupled to the two ends, respectively. A means for selectively coupling the first doped layer to the substrate is provided. The first doped layer is disconnected from the substrate. The contact chain is powered through the two probe pads. A voltage value is measured across the two probe pads and a current value is measured through one of the two probe pads to ascertain the total resistance.

The present invention further provides a debugging method for determining a failed contact structure among a plurality of contact structures. The contact structures are located on a substrate of a first conductive type. A dielectric layer is on the substrate. Each contact structure comprises a contact hole in the dielectric layer and conductive material in the contact hole, and serves to electrically contact with a first doped layer of a second conductive type. The first doped layer selectively coupled to the substrate is formed on the substrate. The steps of the debugging method follow. First, the substrate is coupled to the ground, and the first doped layer is selectively coupled to the substrate. A beam of charge carriers scans the contact structures to obtain first surface responses corresponding to the contact structures. A first specific contact structure is retrieved as the failure contact structure whose first response is unfit for a predetermined requirement.

With the aid of the means for selectively coupling the first doped layer to the substrate, it is very easy to find out a peculiar contact structure among the contact structures of the contact chain. Furthermore, more root causes of the failure contact chain can be determined by analyzing the contact chain of the present invention.

BRIEF DESCRIPTION OF THE DRAWINGS

The present invention can be more fully understood by reading the subsequent detailed description in conjunction with the examples and references made to the accompanying drawings, wherein:

FIGS. 2A and 2B are two diagrams showing the ion beam interacts with a normal, well-formed contact of CS-P and a abnormal, unfilled contact of CS-P, respectively;

FIGS. 2C and 2D are two diagrams showing the ion beam interacting with a normal, well-formed contact of CS-N and an abnormal, unfilled contact of CS-N, respectively;

DETAILED DESCRIPTION OF THE PREFERRED EMBODIMENT

The essence of the present invention is employing a controllable connection means to selectively couple the N+ doped layer under the contact of CS-N to the P-type well thereunder during the failure analysis of FIB, thereby solving the problem caused by the reverse-biased PN junction and enabling the differentiation of normal and abnormal contacts of CS-N. Furthermore, during electric testing, the controllable connection means can properly disconnect the electrical connection between the N+ doped layer and the P-type substrate, so that the measurement of the average contact resistance is not influenced.

Thereafter, a contact chain of CS-N according to the present invention is used as an embodiment. However, the present invention can also be applied to a contact chain of CS-P and the same advantages can be obtained. Changing the conductive type of a device is very common for the person in the art therefor one can achieve a contact chain of CS-P of the present invention after reading the following paragraphs.

Figure 1A:
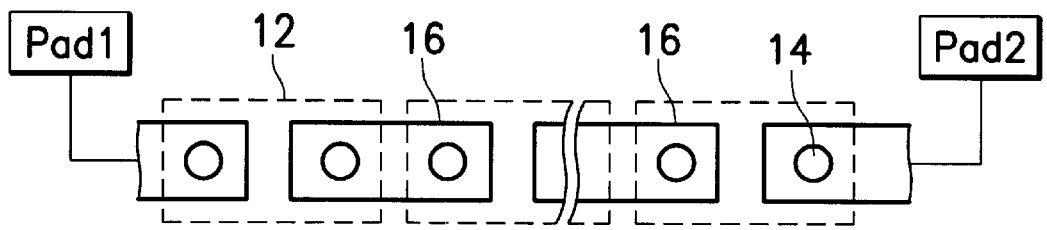
FIG. 1A illustrates a layout of a conventional contact chain.
Figure 1B:
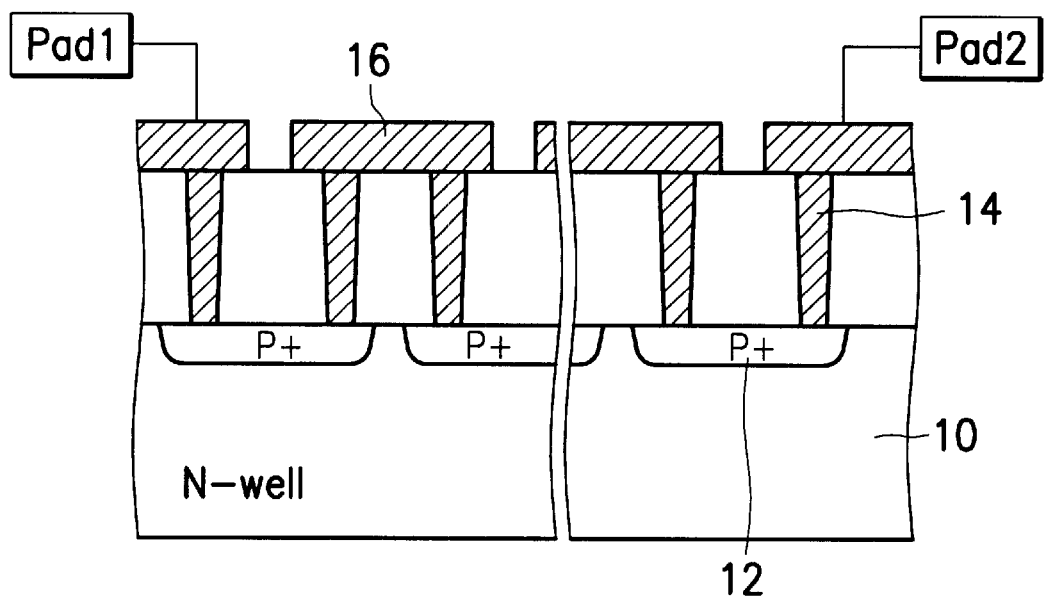
FIG. 1B illustrates a cross-section of the contact chain in FIG. 1A, when it is implemented by contacts of CS-P.
Figure 3:
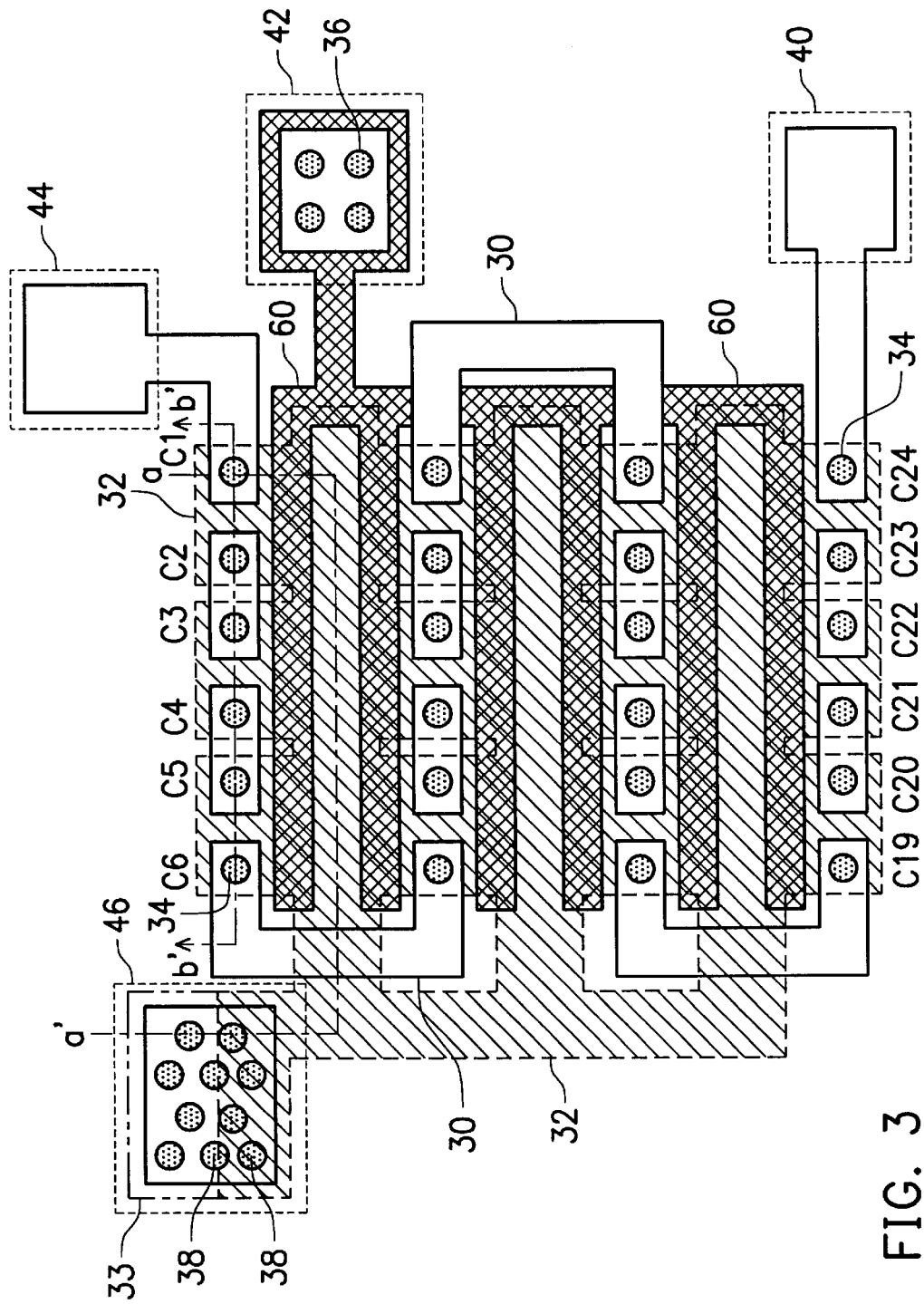
FIG. 3 shows a layout of a contact chain of CS-N according to the present invention.
Figure 4A:
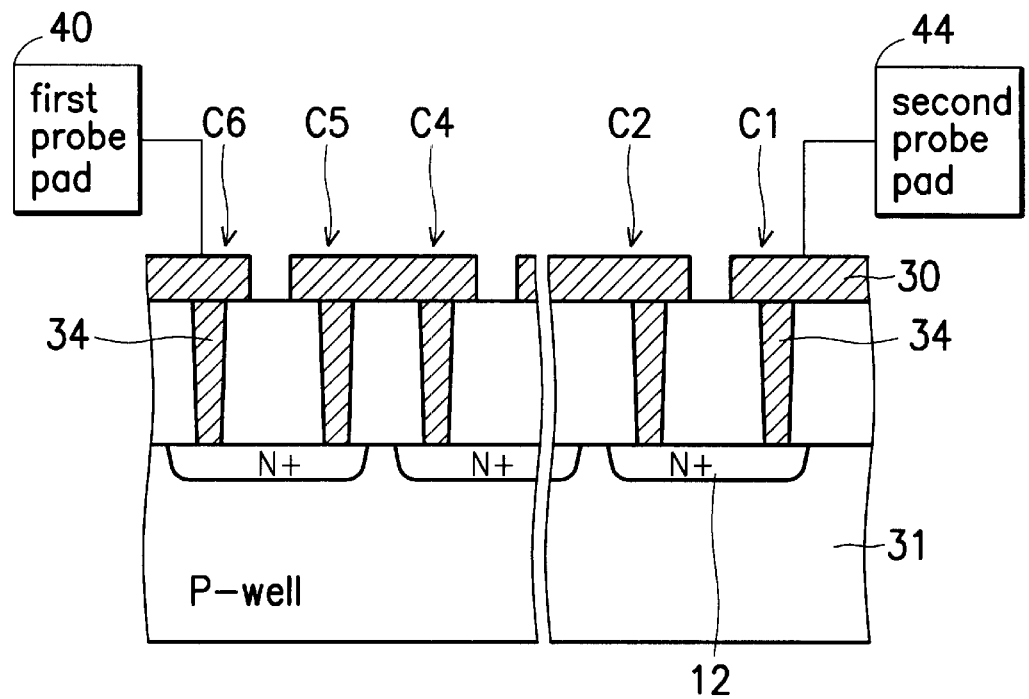
FIG. 4A shows a cross-section of the contact chain structure along the line b'b in FIG. 3.
Figure 4B:
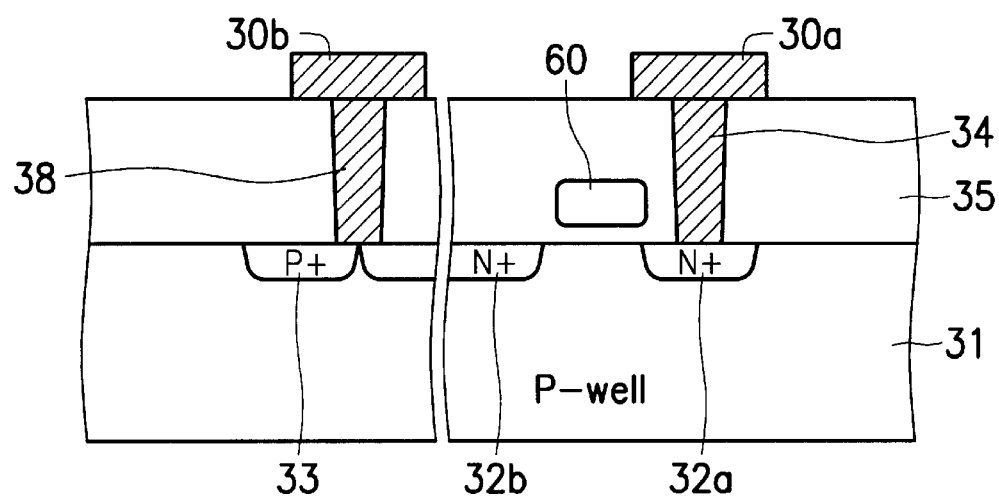
FIG. 4B shows a cross-section of the contact chain structure along the folded line a'a in FIG. 3

FIG. 3 shows a layout of a contact chain of CS-N according the present invention. FIG. 4A, similar with the contact chain in FIG. 1B, shows a cross-section of the contact chain along the line b'b in FIG. 3. FIG. 4B shows a cross-section of the contact chain structure along the folded line a'a in FIG. 3. The contact chain of CS-N is formed on a P-type well 31 and has 24 contacts (C1–C24) of CS-N connected in series and 6 contacts (C1–C6) among them are shown in FIG. 4A. Each contact of CS-N implies a contact structure for electrically connecting a first metal strip 30 and a N+ doped layer (32a or 32b), therefore it can have a contact hole 34 and the conductive material therein. 24 contacts are arranged into 4 contact rows. These 24 contacts are connected to each other through the first metal strips 30 or the N+ doped layers 32a to form a contact chain. The first contact of CS-N, marked as C1, is coupled to a first probe pad 40 via a first metal strip 30, as well as the last contact of CS-N, marked as C24, is coupled to a second probe pad 44 via a first metal strip 30.

Between every two contact rows of CS-N are two control gates 60. All the control gates 60 are coupled to each other, and, through the connection of gate contacts 36, they are coupled to a first metal strip, much larger than others to form a gate pad 42 as shown in FIG. 3.

Between the two control gates 60 is an N+ doped layer 32b. In the layout, the N+ doped layer 32b is extended to border a P+ doped layer 33, an electric contact region of the P-type well 31. There exist on the border between N+ doped layer 32b and the P+ doped layer 33 several substrate contact holes 38 with conductive material inside. Designers must note that some substrate contact holes 38 have parts located on the N+ doped layer 32b and parts located on the P+ doped layer 33, as shown in FIGS. 3 and 4, such that, through the conductive material in the substrate contact holes 38, the N+ doped layer 32b can be coupled to the P+ doped layer 33, electrically equivalent to the P-type well. The first metal strip on the substrate contact holes 38 has a large area to serve as a substrate pad 46.

FIG. 4B shows that each contact of CS-N is positioned adjacent to an NMOS transistor. The N+ doped layer 32a under each contact of CS-N serves as a drain/source electrode of the NMOS transistor, as well as the N+ doped layer 32b serves as another drain/source electrode of the NMOS transistor. The control gate 60 of the NMOS transistor can control the connection between the N+ doped layer 32a and the N+ doped layer 32b coupled to the P-type well 31 through the conductive material in the substrate contact holes 38.

Figure 5:
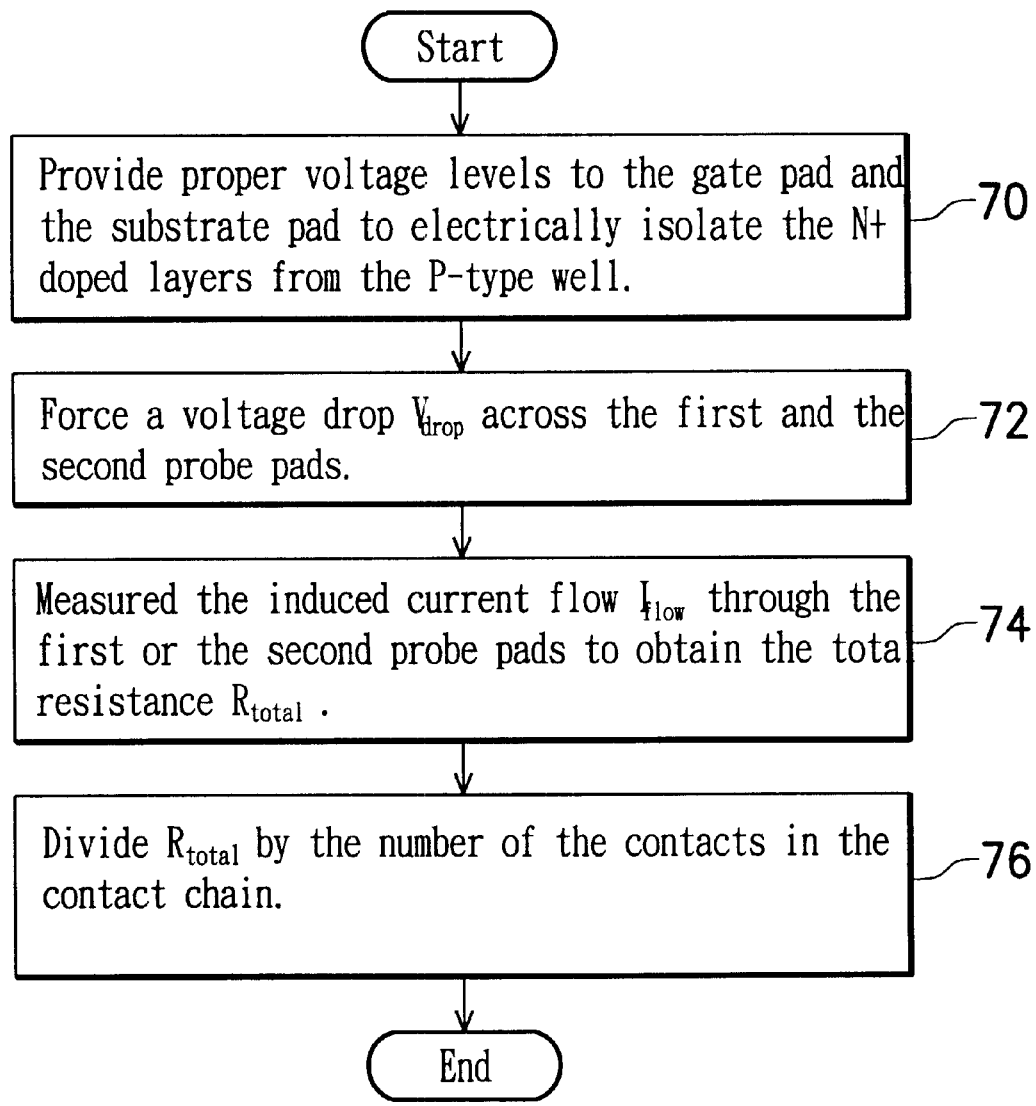
FIG. 5 is a flow chart illustrating the steps for measuring the average contact resistance of the contacts of CS-N in FIG. 3.

FIG. 5 is a flow chart illustrating the steps for measuring the average contact resistance of the contacts of CS-N in FIG. 3. To measure the average contact resistance of the contacts of CS-N, four probes are used to respectively point on the first probe pad 40, the second probe pad 44, the gate pad 42 and the substrate pad 46. Proper voltage levels are provided to the gate pad 42 and the substrate pad 46 to electrically isolate the N+ doped layers 32a from the P-type well 31 (symbol 70). The gate pad 42 and the substrate pad 46 are grounded, for example, to turn the NMOS transistors off and achieve the desired isolation.

Then, a voltage drop $V_{drop}$ across the first and the second probe pads (40, 42) is forced (symbol 72), and the induced current flow $I_{flow}$ through the first or the second probe pads are measured (symbol 74). The total resistance $R_{total}$ of the 24 contacts of CS-N connected in series is subsequently equal to $V_{drop}/I_{flow}$. Therefore, the average resistance for one of the 24 contacts of CS-N is equal to $R_{total}$ divided by 24, the number of the contacts (symbol 76).

Figure 6:
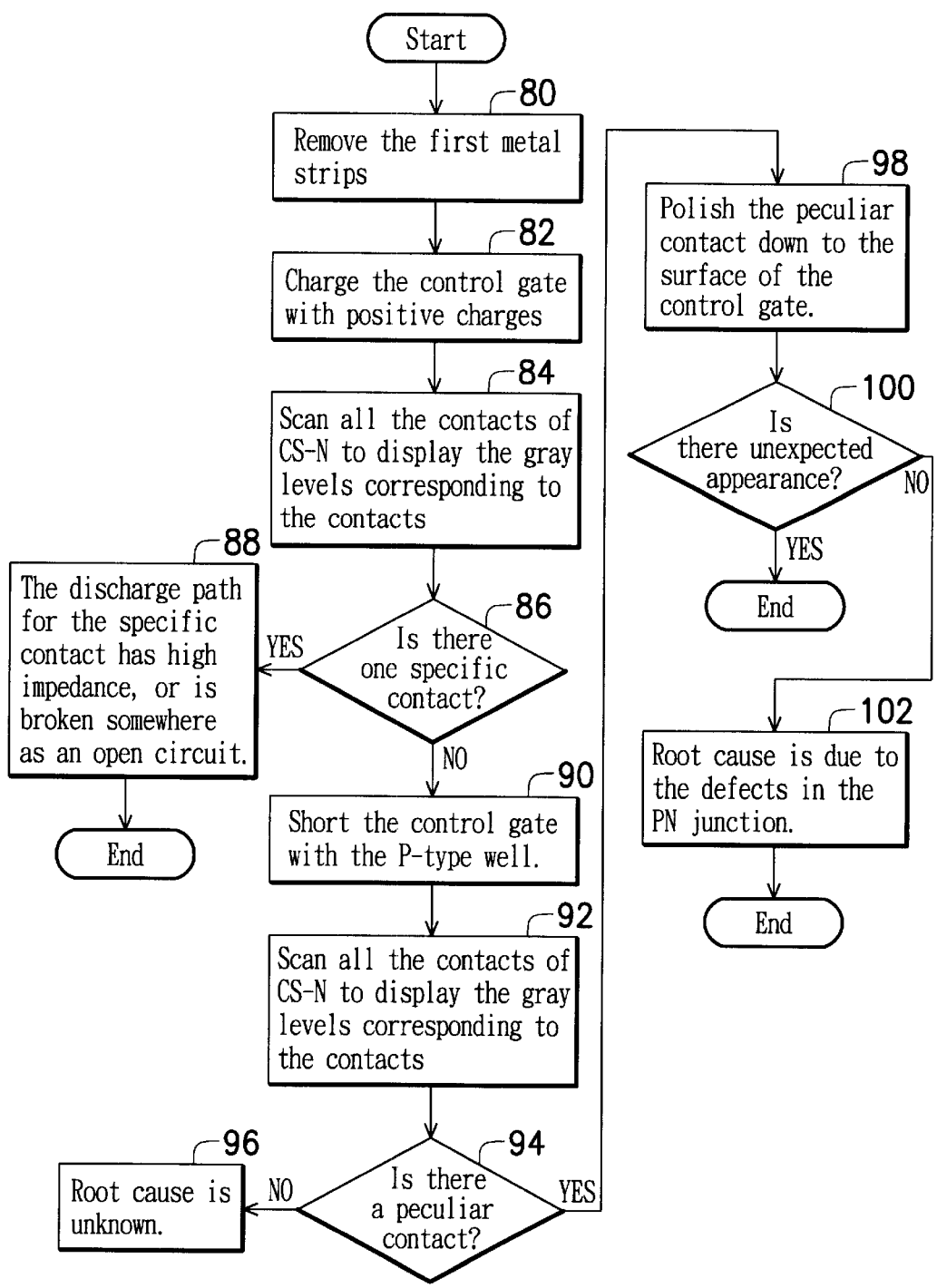
FIG. 6 is a flow chart for illustrating the steps for debugging the contact chain in FIG. 3.

FIG. 6 is a flow chart illustrating the steps for debugging the contact chain in FIG. 3. Once the obtained $R_{total}$ is out of a predetermined, expected resistance range, debugging becomes necessary to find out the root cause of the failure contact chain. The steps for debugging, or failure analysis, are described below.

First of all some pre-processes for making a sample for FIB analysis are needed. These pre-processes, with the aim of exposing the conductive material inside the contact holes, include polishing the top surface of the contact chain to completely remove the first metal strips without damaging the dielectric layer 3S too much (symbol 80).

Then, the sample, the polished contact chain, is put and fixed in a FIB tool. Meanwhile, the P-type well 31 of the contact chain is coupled to the ground of the FIG tool.

Figure 7A:
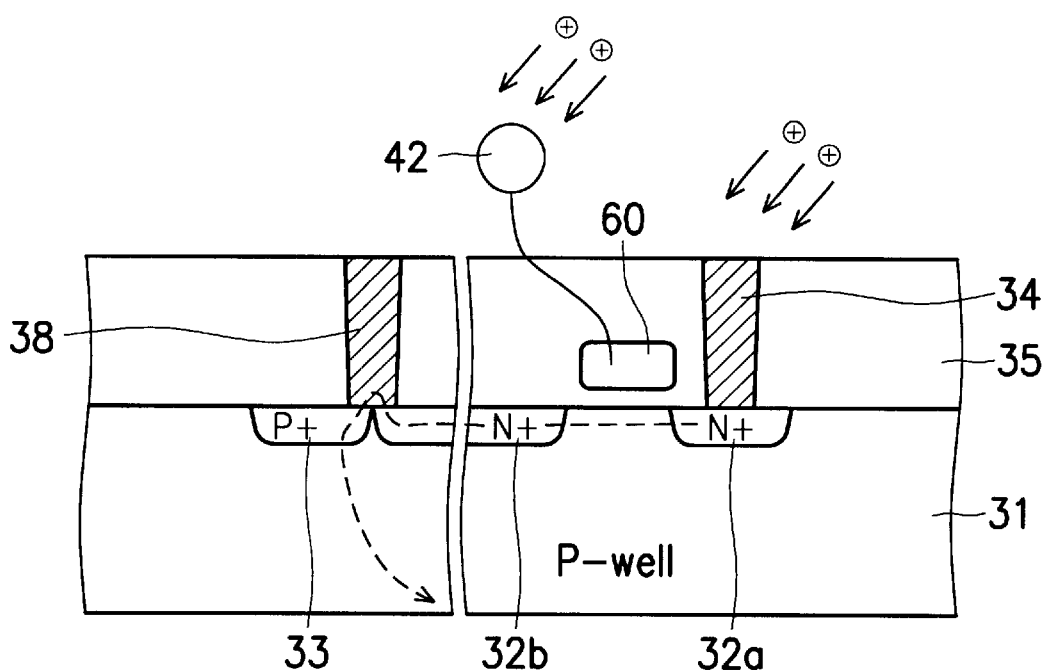
FIG. 7A illustrates the discharge path of a normal, well-filled contact of CS-N according to the present invention.

The positive ion beam in the FIB tool is then used to scan the gate pad 42, charging the control gate 60 with positive charges, as shown in FIG. 7A, and thus the control gate 60 obtains a positive voltage (symbol 82). The NMOS is turned on due to the positive voltage on the control gate to connect its drain and source, the N+ doped layers 32a and the N+ doped layer 32b. It is mentioned before that N+ doped layer 32b is always coupled to the P-type well 31, such that the N+ doped layers 32a are coupled to the grounded P-type well 31 in the meantime.

All the contacts of CS-N are scanned to display the gray levels corresponding to the contacts on the monitor of the FIB tool (symbol 84)

A normal, well-filled contact of CS-N, as shown in the right side of FIG. 7A, has a discharge path consisting of N+ doped layer 32a, the channel under the control gate 60, the N+ doped layer 32b, the conductive material inside the substrate contact hole and the ground P-type well 31 to discharge the received charges. Therefore, it should induce a higher number of secondary electrons to form a brighter pattern on the monitor. Provided that there is one specific contact having a relatively darker pattern on the monitor (the yes route of symbol 86), it infers that the discharge path for the specific contact has high impedance, or is broken somewhere as an open circuit (symbol 88). One possible reason to induce a relatively dark pattern is an unfilled contact, which can be verified by viewing the cross-section of the specific contact cut by the FIB tool.

If all the scanned contacts of CS-N have similar gray levels (the no route of symbol 86), a portion of the gate pad 42 and items thereunder are dug out by the positive ion beam in order to short the control gate with the P-type well 31 (symbol 90). Therefore, the NMOS transistor is turned off due to the grounded control gate, and the N+ doped layer 32b and N+ doped layers 32a are disconnected.

Once again, all the contacts of CS-N are scanned to display the gray levels corresponding to the contacts on the monitor of the FIB tool (symbol 92).

Theoretically, a good, well-structured contact of CS-N has a reverse-biased PN junction with high impedance thereunder during FIB scanning as mentioned before, when the control gate is grounded, therefore high impedance of a good contact should make a darker pattern on the monitor of the FIB tool.

If there is a peculiar contact whose corresponding pattern shown on the monitor is brighter than others (the yes route of symbol 94), this infers that the peculiar contact has a current leakage path with lower impedance and is an abnormal contact.

Figure 7B:
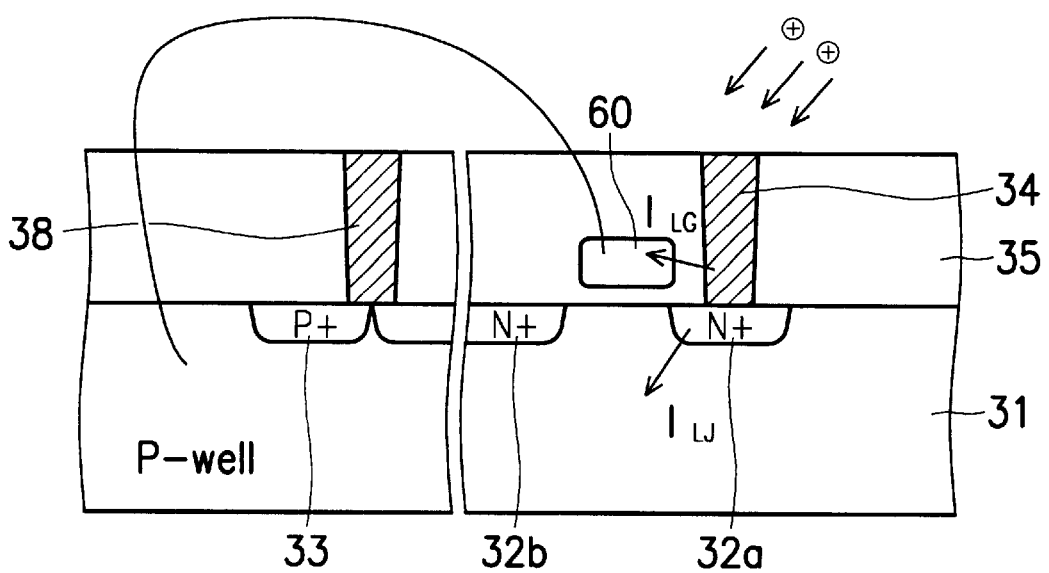
FIG. 7B shows two potential current leakage paths for an abnormal contact of CS-N with low impedance.

FIG. 7B shows two potential current leakage paths for an abnormal contact of CS-N with low impedance. Two reasons may make a peculiar contact of CS-N suffer lower impedance: one is that the control gate 60 somehow shorts with the conductive material in the peculiar contact, so that the charges in the contact leak to the ground through the control gate 60 and the P-type well 31, as shown by the current $I_{LG}$ in FIG. 7B; the other is that the PN junction thereunder has defects to construct the connection between the contact and the P-well 31, as shown by the current $I_{LJ}$ in FIG. 7B.

The short between the conductive material in the peculiar contact and the control gate 60 is usually observed as a peculiar appearance. One can verify this assumption by polishing the peculiar contact down to the surface of the control gate 60 (symbol 98) to check by SEM of FIB if there is any abnormal appearance thereon (symbol 100). Abnormal appearance implies a short of the contact and the control gate 60 (the no route of symbol 100). On the other hand, a normal appearance (the yes route of symbol 100) can conclude the existence of the current leakage path due to the defects in the PN junction (symbol 102).

If, during the second FIB scan, there is little to choose the contacts in terms of their gray levels (the no route of symbol 94), the root cause of the failure contact chain will remain unknown (symbol 90). One possibility is a short due to the first metal strips 30, which should be checked visually before the sample is prepared. The first metal strips 30 are polished away during the preparation of the sample, therefore, can't be checked subsequently.

In comparison with the structure of a conventional contact chain, which makes failure analysis of the contact chain of CS-N difficult, the structure of the contact chain of the present invention employs a NMOS transistor adjacent to the N+ doped layers under the contacts to connect or disconnect the N+ doped layers and the P-well thereunder, therefore the difficulty encountered in the prior art is solved. Furthermore, the structure of the contact chain of the present invention not only eases the difficulty of identifying an unfilled contact of CS-N, but also provides a way to identify whether the failure is due to control gate short of PN junction leakage. All these benefits can't be achieved in the prior art.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for measuring the total resistance of a contact chain, comprising:

providing a plurality of contact structures connected in series and having two ends, each contact structure comprising a contact hole in a dielectric layer and conductive material in the contact hole, and serving to electrically contact with a first doped layer of a second conductive type, wherein the first doped region is formed on a substrate of a first conductive type;

providing two probe pads coupled to the two ends, respectively;

providing a means for selectively coupling the first doped layer to the substrate;

disconnecting the first doped layer from the substrate;

powering the contact chain through the two probe pads; and measuring a voltage value across the two probe pads and a current value through one of the two probe pads to obtain the total resistance.

2. The method as claimed in claim 1, wherein the means for selectively coupling the first doped layer to the substrate comprises a second doped layer of the second conductive type and a control gate, the second doped layer formed on the substrate being coupled to the substrate, the control gate being formed on a surface of the substrate between the first doped layer and the second layer to control the electrical connection between the first doped layer and the second doped layer, and the step of disconnecting the first doped layer from the substrate is providing a voltage to the control gate.

3. The method as claimed in claim 2, further comprises a step providing a substrate contact hole, conductive material in the substrate contact hole and a third doped layer of the first conductive type, the third doped layer being formed on the substrate in order to couple the second doped layer to the substrate, portion of the substrate contact hole being located on the second doped layer, and portion of the substrate contact hole being located on the third doped layer.

4. A debugging method for determining a failed contact structure among a plurality of contact structures, the contact structures being located on a substrate Of a first conductive type, a dielectric layer being on the substrate, each contact structure comprising a contact hole in the dielectric layer and conductive material in the contact hole, and serving to electrically contact with a first doped layer of a second conductive type, wherein the first doped layer selectively coupled to the substrate is formed on the substrate, the debugging method comprises:

coupling the substrate to ground;

selecting to couple the first doped layer to the substrate;

scanning the contact structures by a beam of charge carriers to obtain first surface responses corresponding to the contact structures; and retrieving a first specific contact structure as the failure contact structure whose first response is unfit for a predetermined requirement.

5. The debugging method as claimed in claim 4, wherein the first doped layer is controlled by a control gate to selectively couple to a second doped layer of the second conductive type, the second doped layer being coupled to the substrate, and the step of selecting to couple the first doped layer to the substrate is implemented by charging the control gate with the beam of charge carriers to couple the first doped layer to the second doped layer.

6. The debugging method as claimed in claim 5, wherein there is at least a gate contact hole with conductive material inside on the control gate, the step of charging is implemented by scanning the gate contact hole by the beam of charge carriers.

7. The debugging method as claimed in claim 4, when the first specific contact structure is not found, the debugging method further comprises the following steps:

electrically isolating the first doped layer from the substrate;

scanning the contact structures by the beam of charge carriers to obtain second surface responses corresponding to the contact structures; and retrieving a second specific contact structure as the failure contact structure whose second response is unfit for another predetermined requirement.

8. The debugging method as claimed in claim 7, wherein the first doped layer is controlled by a control gate to selectively couple to a second doped layer of the second conductive type, and the step of electrically isolating is implemented by cutting the control gate by using the beam of charge carriers to couple the control gate to the substrate, thereby isolating the first doped layer from the substrate.

9. The debugging method as claimed in claim 8, the debugging method further comprising a following step:

polishing the second specific contact structure to a surface of the control gate to determine if the second specific contact structure shorts with the control gate.

10. The debugging method as claimed in claim 4, wherein the charge carriers are positively charged.

11. The debugging method as claimed in claim 4, wherein the first conductive type is N type and the second conductive type is P type.

12. The debugging method as claimed in claim 4, wherein the first conductive type is P type and the second conductive type is N type.

* * * * *